US008045260B2

(12) United States Patent
Bhatia et al.

(10) Patent No.: US 8,045,260 B2
(45) Date of Patent: Oct. 25, 2011

(54) OPTIMIZED SIGNAL CONTROL IN FREQUENCY-DOUBLED LASER SOURCES

(75) Inventors: Vikram Bhatia, Painted Post, NY (US); Jacques Gollier, Painted Post, NY (US); Dragan Pikula, Horseheads, NY (US); Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 580 days.

(21) Appl. No.: 12/288,639

(22) Filed: Oct. 22, 2008

(65) Prior Publication Data
US 2010/0098116 A1    Apr. 22, 2010

(51) Int. Cl.
*H01S 3/136* (2006.01)
*H01S 3/131* (2006.01)
*H01S 3/10* (2006.01)

(52) U.S. Cl. ................... 359/337.4; 359/346; 372/33
(58) Field of Classification Search ............ 359/337.4, 359/346; 372/33
See application file for complete search history.

(56) References Cited

U.S. PATENT DOCUMENTS

| 5,212,588 | A |   | 5/1993  | Viswanathan et al. ....... 359/355 |
| 5,341,183 | A | * | 8/1994  | Dorsey-Palmateer ....... 353/122 |
| 5,381,258 | A | * | 1/1995  | Bordignon et al. ......... 359/202.1 |
| 5,386,124 | A | * | 1/1995  | Yasuda et al. ............. 250/585 |
| 5,430,662 | A | * | 7/1995  | Ahonen .................... 703/1 |
| 5,444,505 | A | * | 8/1995  | Dorsey-Palmateer ......... 353/28 |
| 5,450,147 | A | * | 9/1995  | Dorsey-Palmateer ......... 353/28 |
| 5,506,641 | A | * | 4/1996  | Dorsey-Palmateer ......... 353/28 |
| 5,651,600 | A | * | 7/1997  | Dorsey-Palmateer ....... 353/122 |
| 5,661,667 | A | * | 8/1997  | Rueb et al. ............... 702/95 |
| 5,903,996 | A | * | 5/1999  | Morley ................... 42/115 |
| 6,000,801 | A | * | 12/1999 | Dillon et al. ............... 353/28 |
| 6,359,847 | B1 |   | 3/2002  | Shimizu ................ 369/53.26 |
| 6,577,429 | B1 | * | 6/2003  | Kurtz et al. ............... 359/279 |
| 6,587,600 | B1 |   | 7/2003  | Shipley ................... 382/284 |
| 6,600,590 | B2 | * | 7/2003  | Roddy et al. .............. 359/287 |
| 7,313,156 | B2 | * | 12/2007 | Fujii et al. .............. 372/29.011 |
| 2005/0243879 | A1 |   | 11/2005 | Horiuchi et al. .......... 372/38.07 |
| 2007/0133629 | A1 | * | 6/2007  | Hu et al. .................. 372/26 |
| 2008/0055318 | A1 |   | 3/2008  | Glen ..................... 345/501 |
| 2008/0063016 | A1 |   | 3/2008  | Bhatia et al. ............. 372/34 |
| 2008/0075132 | A1 |   | 3/2008  | Hu et al. ................. 372/34 |
| 2008/0089370 | A1 |   | 4/2008  | Bhatia et al. ............. 372/32 |
| 2008/0089373 | A1 |   | 4/2008  | Bhatia et al. .......... 372/38.02 |
| 2008/0232412 | A1 |   | 9/2008  | Mizuuchi et al. .......... 372/22 |
| 2009/0067459 | A1 | * | 3/2009  | Mizuuchi et al. .......... 372/25 |

FOREIGN PATENT DOCUMENTS
JP    2005-327823    11/2005
* cited by examiner

*Primary Examiner* — Mark Hellner
*Assistant Examiner* — Ari M Diacou
(74) *Attorney, Agent, or Firm* — Gregory V. Bean (57) ABSTRACT

The present disclosure relates generally to semiconductor lasers and laser projection systems. According to one embodiment of the present disclosure, a method of operating a laser projection system is provided. According to the method, the laser projection system is utilized to display a sequence of pixelized image frames comprising an alternating sequence of relatively high intensity active projection periods $\text{Mod}_{ON}$ and relatively low intensity inactive projection periods $\text{Mod}_{OFF}$. A complementary control signal transitions between an active state $Q_{ON}$ during the relatively high intensity active projection periods $\text{Mod}_{ON}$ and an inactive state $Q_{OFF}$ during the relatively low intensity inactive projection periods $\text{Mod}_{OFF}$. The transition of the complementary control signal from the inactive state $Q_{OFF}$ to the active state $Q_{ON}$ is conditioned to anticipate initiation of relatively high intensity active projection periods $\text{Mod}_{ON}$ such that it is optimized upon initiation of the relatively high intensity active projection periods $\text{Mod}_{ON}$. Additional embodiments are disclosed and claimed.

19 Claims, 4 Drawing Sheets

OPTIMIZED SIGNAL CONTROL IN FREQUENCY-DOUBLED LASER SOURCES

BACKGROUND OF THE INVENTION

The present disclosure relates generally to semiconductor lasers and, more particularly, to schemes for decreasing power consumption in frequency-doubled semiconductor laser sources.

SUMMARY OF THE INVENTION

The present disclosure relates generally to semiconductor lasers, which may be configured in a variety of ways. For example and by way of illustration, not limitation, short wavelength sources can be configured for high-speed modulation by combining a single-wavelength semiconductor laser, such as a distributed feedback (DFB) laser, a distributed Bragg reflector (DBR) laser, or a Fabry-Perot laser with a light wavelength conversion device, such as a second harmonic generation (SHG) crystal, e.g., MgO-doped periodically poled lithium niobate (PPLN). The SHG crystal can be configured to generate higher harmonic waves of the fundamental laser signal by tuning, for example, a 1060 nm DBR or DFB laser to the spectral center of a SHG crystal, which converts the wavelength to 530 nm.

The power consumption of a frequency doubled laser system can be the result of two or more different types of signals applied to the system. One type can be referred to generally as the gain control signal because it is applied to the gain control elements of the IR semiconductor laser. Additional types of control signals can be referred to generally as complementary control signals and are applied to complementary control elements of the laser. These complementary control signals can function in a variety of ways and can generally be used to optimize efficiency, stabilize emission, enhance emission quality, etc. For example, and not by way of limitation, one type of complementary control signal operates on the wavelength tuning mechanism of the semiconductor laser to control the emission wavelength of the semiconductor laser to keep the wavelength of the laser aligned with the phase matching wavelength of the PPLN crystal or other SHG device as the temperature of the system drifts over time. Another type of complementary control signal operates on the phase section of the semiconductor laser and can be used to send high frequency signals to the phase section of the laser in order to randomize the laser mode selection or to control the phase section is some other manner to optimize emission. In addition, it is contemplated that the complementary control signal may be used to cooperate with an optical alignment mechanism to control optical coupling between the semiconductor laser and the SHG device and compensate for thermal or mechanical misalignment. It is also contemplated that the complementary control signal can be utilized to control a temperature control mechanism of the semiconductor laser to optimize emission.

The present inventors have recognized that, although these and other types of complementary control signals are needed the help enhance SHG conversion efficiency, optimize image quality, or maintain optimum coupling efficiency, they often do not contribute directly to create power. Accordingly, one object of the present disclosure is to provide schemes for minimizing the power dedicated to these complementary control signals.

In most laser projection systems, laser sources are often switched OFF over significant periods of time so the Gain signal applied to the pump laser comprises an alternating sequence of relatively high intensity active projection periods $Mod_{ON}$ and relatively low intensity inactive projection periods $Mod_{OFF}$. As there is no signal to be displayed during periods $Mod_{OFF}$, some of the complementary control signals can also be set to an inactive state $Q_{OFF}$. These complementary control signals are then made of a succession of active states $Q_{ON}$ and $Q_{OFF}$ that are synchronized with $Mod_{ON}$ and $Mod_{OFF}$ periods and therefore saves a significant amount of power consumption.

In some cases, the wave forms defining these complementary control signals are conditioned to ensure that the right state is achieved when the laser is switched ON at the very beginning of $Mod_{ON}$. For example, it is contemplated that the complementary control signal can be configured to transition to the active state $Q_{ON}$ prior to initiation of the relatively high intensity active projection periods $Mod_{ON}$ such that it is optimized upon initiation of the relatively high intensity active projection periods $Mod_{ON}$. The complementary control signal may also comprise an amplitude overshoot that anticipates initiation of the relatively high intensity active projection periods $Mod_{ON}$ and decreases over time after initiation of the relatively high intensity active projection periods $Mod_{ON}$. In one embodiment, the complementary control signal comprises a low pass filtered square wave that transitions to the active state $Q_{ON}$ prior to initiation of the relatively high intensity active projection periods $MD_{ON}$.

According to one embodiment of the present disclosure, a method of operating a laser projection system is provided. According to the method, the laser projection system is utilized to display a sequence of pixelized image frames comprising an alternating sequence of relatively high intensity active projection periods $Mod_{ON}$ and relatively low intensity inactive projection periods $Mod_{OFF}$. A complementary control signal transitions between an active state $Q_{ON}$ during the relatively high intensity active projection periods $Mod_{ON}$ and an inactive state $Q_{OFF}$ during the relatively low intensity inactive projection periods $Mod_{OFF}$. The transition of the complementary control signal from the inactive state $Q_{OFF}$ to the active state $Q_{ON}$ is conditioned to anticipate initiation of relatively high intensity active projection periods $Mod_{ON}$ such that it is optimized upon initiation of the relatively high intensity active projection periods $Mod_{ON}$. Additional embodiments are disclosed and claimed.

BRIEF DESCRIPTION OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
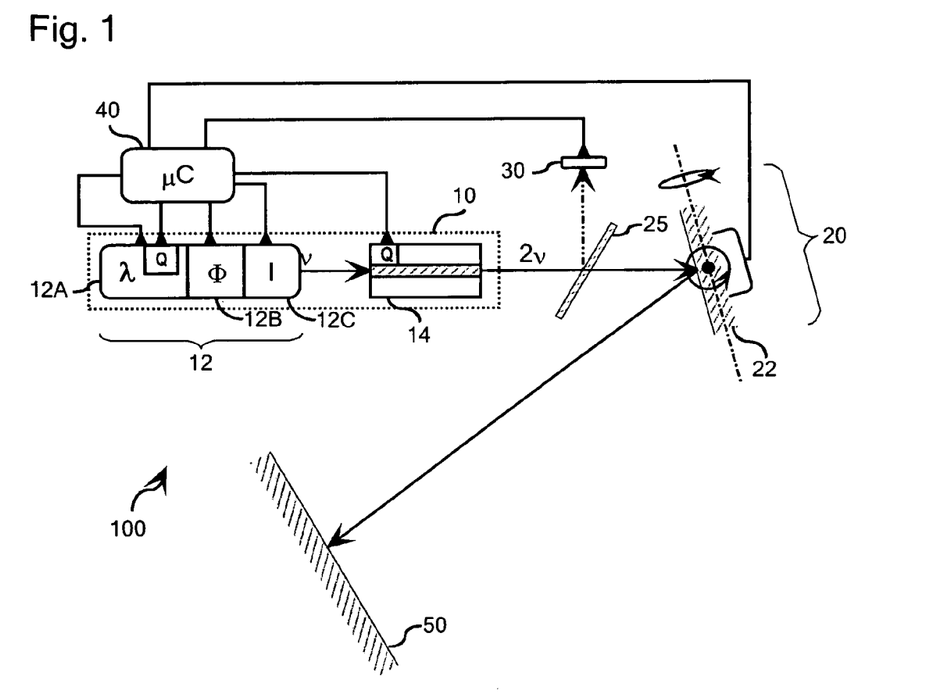
FIG. 1 is a schematic illustration of a scanning-type laser projection system suitable for executing various control schemes according to particular embodiments of the present disclosure.

Referring initially to FIG. 1, the concepts of the present disclosure may be conveniently illustrated with general reference to a laser source 10 comprising a two or three-section DBR-type semiconductor laser 12, although the concepts of the present disclosure can be executed in the context of various types of semiconductor lasers, the design and operation of which is described generally above and is taught in readily available technical literature relating to the design and fabrication of semiconductor lasers. In the context of a frequency-doubled light source of the type illustrated in FIG. 1, the DBR laser 12 is optically coupled to a light wavelength conversion device 14. The DBR laser 12 illustrated schematically in FIG. 1 comprises a wavelength selective section 12A, a phase section 12B, and a gain section 12C. The light beam emitted by the semiconductor laser 12 can be either directly coupled into the waveguide of the wavelength conversion device 14 or can be coupled through collimating and focusing optics or some other type of suitable optical element or optical system. For example, the system may include an active element such one or more MEMS mirrors to adjust and maintain optical alignment between the semiconductor laser 12 and the wavelength conversion device 14. In any case, the wavelength conversion device 14 converts the incident light $v$ into higher harmonic waves $2v$ and outputs a converted signal having a wavelength-converted intensity $I_{2v}$.

This type of configuration is particularly useful in generating shorter wavelength laser beams from longer wavelength semiconductor lasers and can be used, for example, as a visible laser source 10 for a single-color laser projection system 100 or a multi-color RGB laser projection system comprising, for example, the laser source 10, laser projection optics 20, an optional partially reflective beam splitter 25 and optical intensity monitor 30, and a controller 40, which may be stand-alone laser controller or a programmable projection controller incorporating a laser controller. The laser projection optics 20 may comprise a variety of optical elements including, but not limited to, a two-axis, gimbal mounted, MEMS scanning mirror 22. These optical elements cooperate to generate a two-dimensional scanned laser image on a projection screen 50 or in an image field.

The wavelength selective section 12A of the semiconductor laser 12, which can also be referred to as the DBR section of the laser 12, typically comprises a first order or second order Bragg grating positioned outside the active region of the laser cavity. This section provides wavelength selection, as the grating acts as a mirror whose reflection coefficient depends on the wavelength. The gain section 12C of the DBR laser 12 provides the major optical gain of the laser. The phase section 12B may also be employed to create an adjustable phase shift between the gain material of the gain section 12C and the reflective material of the wavelength selective section 12A. A high frequency perturbation signal can be sent to the phase section 12B to randomize the spectral modes selected by the laser and, therefore eliminate any systematic organized defects as the output beam is scanned across successive image frames.

The wavelength selective section 12A may be provided in a number of suitable alternative configurations that may or may not employ a Bragg grating. Configurations are also contemplated that utilize Bragg resonators inside the SHG crystal or any other type of spectrally selective component inserted into the optical path.

The partially reflective beam splitter 25 can be configured to direct a portion of the light generated by the laser source 10 to the optical intensity monitor 30. The optical intensity monitor 30 can be configured to generate an electrical or optical signal representing variations in the intensity of the light generated by the laser source 10. It is contemplated that a variety of alternative configurations may be utilized to monitor the intensity of the output beam without departing from the scope of the present disclosure. It is noted that the beam splitter 25, the laser source 10, the optical intensity monitor 30, and the controller 40 are merely illustrated schematically in FIG. 1, and that their respective positions and orientations relative to each other may vary widely according to the specific needs of the particular field in which the system is utilized.

The controller 40, which is in communication with the optical intensity monitor 30, can receive or sample the signal from the optical intensity monitor 30 and can be programmed to control the laser source as a function of the sampled intensity. For example, the controller 40 can be programmed to establish and maintain the aforementioned wavelength matching between the output of the semiconductor laser 12 and the conversion bandwidth of the wavelength conversion crystal 14 by controlling heating elements that are thermally coupled to the wavelength selective section 12A of the semiconductor laser 12.

More specifically, the output power of the higher harmonic light wave generated in the wavelength conversion device 14 can change drastically as the alignment of the output wavelength of the DBR laser 12 relative to the wavelength conversion bandwidth of the wavelength conversion device 14 changes. For example, when a semiconductor laser is modulated to produce data, the thermal load on the laser varies constantly. The controller 40 can be programmed to utilize the sampled intensity and the aforementioned heating elements to help mitigate the effects of the varying thermal load by controlling the temperature of the wavelength selective section 12A of the laser or the temperature of the wavelength conversion device 14 to stabilize the output power of the higher harmonic light generated by the wavelength conversion device 14.

One embodiment of the present disclosure can be illustrated with reference to FIGS. 1, 2, and 5. As is noted above, FIG. 1 illustrates a scanning-type projection system 100 comprising a temperature-controlled laser source 10 and associated laser projection optics 20. The temperature-controlled laser source 10 comprises a semiconductor laser 12 that is optically coupled to a wavelength conversion device 14. One or more heat generating elements 16 are thermally coupled to the semiconductor laser 12, the wavelength conversion device 14, or both, to control the temperature thereof. Typically, the heat generating elements comprise electrically resistive heating elements but the heat generating elements may alternatively comprise electrodes positioned to inject electrical current into the wavelength selective section of the semiconductor laser 12.

Figure 2:
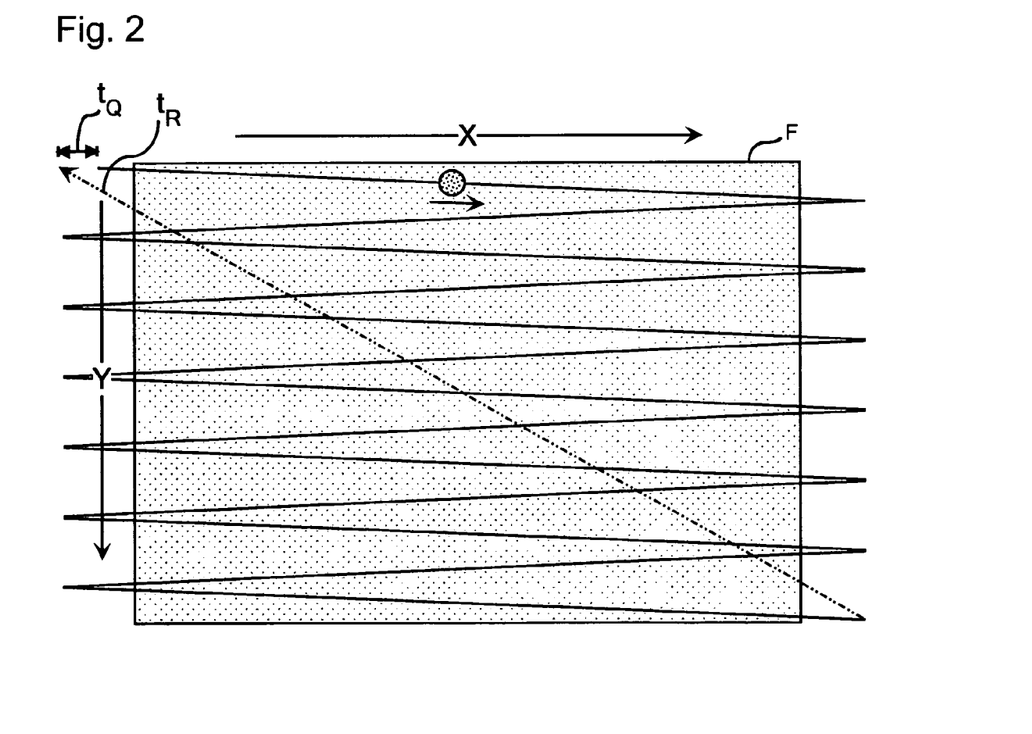
FIGS. 2-4 are schematic illustrations of raster scan patterns that can be generated using the scanning-type projection system of FIG. 1.

FIG. 2 is a schematic illustration of a raster scan pattern that can be generated using the scanning-type projection system 100. The spacing and angle of the scan lines illustrated therein are exaggerated for illustrative purposes. As is illustrated in FIG. 2, in scanning-type projectors, the image can be formed by "fast scanning" a single or multi-color laser spot over a projection screen and modulating directly the laser(s) with a video signal. As the speed of the spot varies along the lines of the frame F, it is often necessary to correct the video signal to avoid image distortion and insure constant image brightness. At the end of each frame line, the speed of the spot falls to zero making some portion of the lines unusable. As a result, the laser(s) often need to be switched off at the end of each line for a few microseconds. At the end of each image frame F, the slow scanning axis is activated to jump from the last line of the frame F to the first line of the next frame F. Typically, the physical limitations of the scanning optics require that a given amount of time needs to be dedicated to a raster return and restart operation before the next frame is projected. Accordingly, a typical set of operational data for a scanning-type system will include a relatively large total frame duration (e.g., 10-20 ms) comprising a very large number of relatively short duration frame lines (e.g., 20-30 μsec). Because each frame-to-frame transition incorporates a significant projection delay between frames (e.g., a few ms) and each frame line incorporates a significant amount of off time (e.g., a few μsec), the effective duty factor of the scanner is typically well below 75% and is often as low as about 50%.

As is noted above, in addition to a conventional gain signal, frequency doubled laser systems can be configured to utilize one or more complementary control signals to optimize efficiency, stabilize emission, enhance emission quality, etc. For example, and not by way of limitation, according to one embodiment disclosed herein three independent complementary control signals are utilized to optimize laser output: a signal $Q_{DBR}$ applied to the wavelength selective section 12A of the laser 12 to keep the wavelength of the laser 12 centered on the optimum SHG wavelength; a relatively high frequency phase conditioning signal $Q_{PH}$ applied to the phase section 12B of the laser 12 to optimize the image quality; and, an alignment signal $Q_{MEMS}$ applied to a MEMS mirror or other optical alignment mechanism to control optical coupling between the semiconductor laser and the SHG device and compensate for thermal or mechanical misalignment. If these control signals are set to values at or near zero during the relatively low intensity inactive projection periods $Mod_{OFF}$, power savings equivalent to the inverse of the projector duty factor, e.g., about 25 to 50%, can be obtained.

More specifically, when using direct current injection for the phase conditioning signal $Q_{PH}$, the response time of the phase section 12B is typically on the order of a few nanoseconds, which is much faster than the typical "END OF LINE" OFF time and the "END OF FRAME" OFF time of a frame-based raster scanner projection system. As a consequence, the phase section 12B can be switched OFF during either of these relatively low intensity inactive projection periods $Mod_{OFF}$.

When using micro-heaters located, for instance, on top of the wavelength selective section 12A of the laser 12, for $Q_{DBR}$, the fastest time constant is in the microsecond scale which is too slow to allow switching $Q_{DBR}$ OFF at each "END OF LINE". In that case, $Q_{DBR}$ will typically only be switched OFF at each "END OF FRAME" period.

Another important aspect to be considered when using slower time constant devices such as micro-heaters is linked to the fact that heat must dissipate into the structure during operation. As a consequence, these types of systems have many different time constants instead of one single time constant. So, it is difficult to avoid slow drifts due to excitation of the slower time constants by merely incorporating simple pulses in the $Q_{DBR}$ signal to create active and inactive states. As an alternative, more elaborate, pre-calibrated $Q_{DBR}$ signals can be used. For example, the $Q_{DBR}$ signal can include a short overshoot period slightly ahead of time with respect to the "BEGINNING OF FRAME" time as well a slowly decreasing region during the frame.

Where an alignment signal $Q_{MEMS}$ is applied to a MEMS mirror or other optical device to maintain optical alignment, the typical natural frequency of a fast MEMS mirror can be as high as 50 kHz, which would be sufficient to permit shutdown of the alignment signal $Q_{MEMS}$ at "END OF FRAME". However, here again, it may be preferable to utilize a specially shaped signal $Q_{MEMS}$ for application to the MEMS mirror in order to avoid creating image artifacts. Indeed, the movement of a MEMS mirror often incorporates a low damping second order equation component and, as a consequence, if the alignment signal $Q_{MEMS}$ is merely a square pulse, the natural frequency of the mirror gets excited resulting in oscillations that very slowly disappear. To avoid this problem, the signal can be filtered with a low-pass filter function to eliminate frequencies close to the natural frequency of the MEMS. This filtering is preferably applied before initiation of the relatively high intensity active projection periods $Mod_{ON}$ to make sure that the mirror is in place at "BEGINNING OF FRAME."

Figure 5:
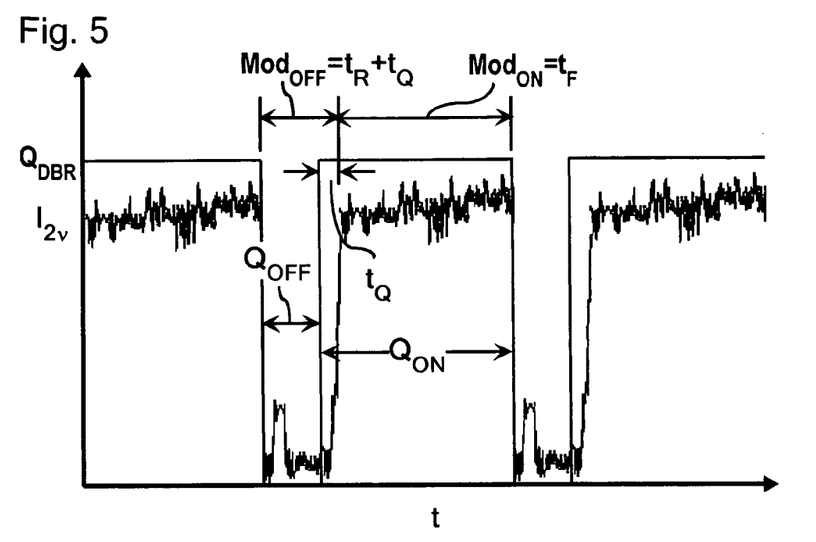
FIGS. 5-7 are illustrations of heating element control signals and wavelength converted output intensity signals according to a variety of embodiments of the present disclosure.

Referring to the heating element control signal $Q_{DBR}$ illustrated in FIG. 5, according to one embodiment of the present disclosure, when the laser 10 is switched OFF at the aforementioned frame-to-frame transitions, the intensity $I_{2v}$ of the wavelength-converted signal drops and the heating element control signal $Q_{DBR}$ is switched OFF. As a result, depending on the duration of the characteristic response time $t_Q$ of the heat generating elements 16, the control scheme of FIG. 5 can lead to significant improvements in power consumption. Accordingly, heating element control signals $Q_{DBR}$ similar to that illustrated in FIG. 5 can be applied to the heat generating elements 16 of the laser source 10 to control the temperature of one or more components of the laser source 10 and improve stability in the emission wavelength of the laser source 10. For example, in the case of a DBR laser, the heating element control signals $Q_{DBR}$ can be applied to control the temperature of the phase section and/or the wavelength selective DBR section of the laser.

As is illustrated in FIG. 5, in the case where the laser source 10 and the projection optics 20 are configured to display a sequence of pixelized image frames F, one of which is illustrated schematically in FIG. 2, the sequence of pixelized image frames will comprise an alternating sequence of relatively high intensity active projection periods $Mod_{ON}$ and relatively low intensity inactive projection periods $Mod_{OFF}$. To minimize, or at least decrease, power consumption by the heating elements 16, the heating element control signal $Q_{DBR}$ can be configured to transition from an active heating state $Q_{ON}$ during the relatively high intensity active projection periods $Mod_{ON}$ to an inactive heating state $Q_{OFF}$ during the relatively low intensity inactive projection periods $Mod_{OFF}$. To do so, the relatively low intensity inactive projection periods $Mod_{OFF}$ should preferably be longer than the characteristic response time $t_Q$ of the heat generating elements.

As will be appreciated by those practicing aspects of the present disclosure, the heating element control signal $Q_{DBR}$ illustrated in FIG. 5 is a fairly simple control signal, it is contemplated that the heating element control signal $Q_{DBR}$, which is applied to stabilize output power of the higher harmonic light generated by the wavelength conversion device 14 by matching the emission wavelength of the semiconductor laser 12 to the maximum conversion wavelength of the wavelength conversion device 14 during the active projection periods $Mod_{ON}$, may be modified to anticipate the start of the active projection periods $Mod_{ON}$. If necessary, this "head start" to the heating element control signal $Q_{DBR}$, which is illustrated in FIG. 5, may further incorporate an overshoot preheating pulse in the "head start" portion of the signal to compensate for the relatively slow response time $t_Q$ of the heating elements 16. Given the structure of the projection system illustrated in FIG. 1, which includes an optical intensity monitor 30 in communication with the controller 40, the heating element control signal $Q_{DBR}$ can also be at least partially a function of the output intensity $I_{2v}$ of the wavelength conversion device 14.

The active projection periods $Mod_{ON}$ are correlated with the frame durations $t_F$ of the laser source and the inactive projection periods $Mod_{OFF}$ are correlated with the transitions between successive frames in the sequence of image frames. In the case of scanning-type projection systems, the duration of these transitions between successive frames typically correspond to the time required for raster return and restart operations $t_R$. In the case of multi-color non-scanning frame projectors, the duration $t_R$ of these transitions typically corresponds to the time required for the projection of multiple colors. In any case, the inactive projection periods $Mod_{OFF}$ can be further correlated with the characteristic response time $t_Q$ of the heat generating elements. As such, the inactive projection periods $Mod_{OFF}$ of FIG. 5 are illustrated as being long enough to span the inactive heating state $Q_{OFF}$ and the characteristic response time $t_Q$ of the heat generating elements 16.

Figure 3:
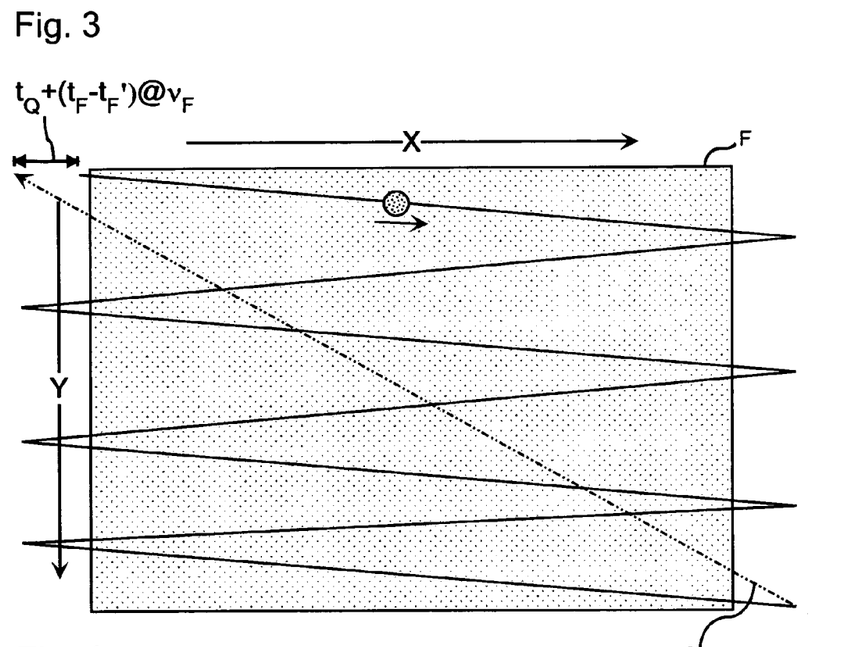
Figure 6:
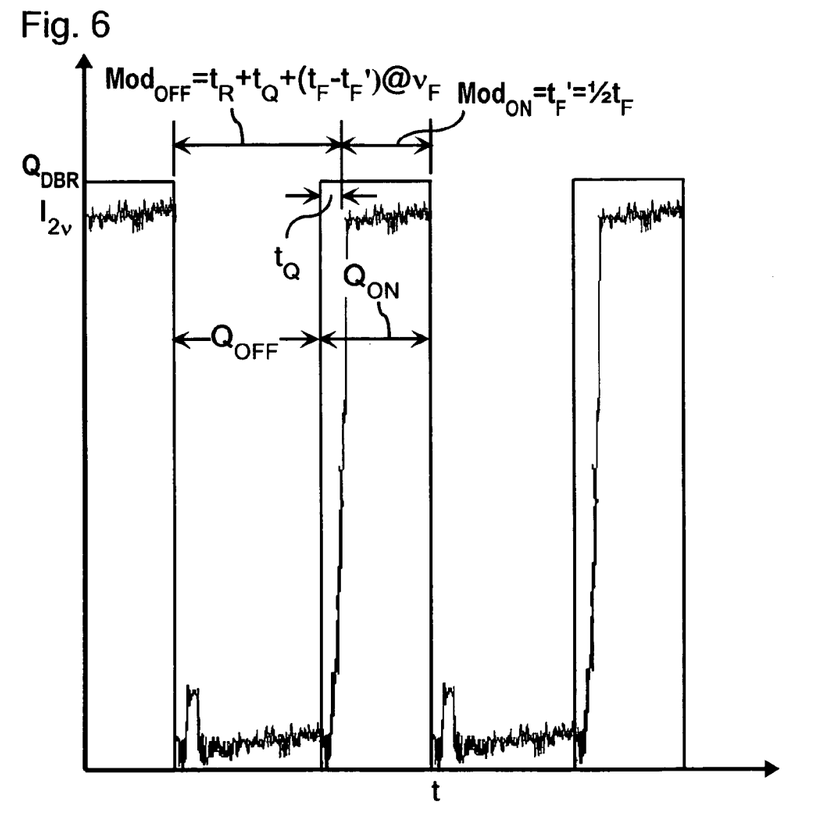

As is noted above, power consumption can be improved by correlating projection OFF time with heating element OFF time. FIGS. 3 and 6 illustrate control schemes designed to increase the OFF time of the laser source 10 during projection, thus increasing potential heating element OFF time. In FIGS. 3 and 6, power consumption is traded against image resolution by taking a projector designed for one resolution (e.g., 1024×768) and reducing the resolution by increasing the slow-scanning axis speed by, e.g., a factor of two. By generating a lower resolution image (e.g., 512×768) in half the time needed for the full resolution image, i.e., ½ $t_F$, and by reducing the active projection periods $Mod_{ON}$ to reduced frame durations $t_F'=½t_F$, the inactive projection periods $Mod_{OFF}$ can be expanded to cover the transition periods $t_R$ between successive frames, the characteristic response time $t_Q$ of the heat generating elements, and the unused frame projection time $t_F$-$t_F'$ created by executing the reduced frame durations $t_F'$. In executing this operation, it will typically be necessary to drive the laser at increased power $I_{2v}$ during the active projection periods $Mod_{ON}$ to keep average power and image brightness constant.

Figure 4:
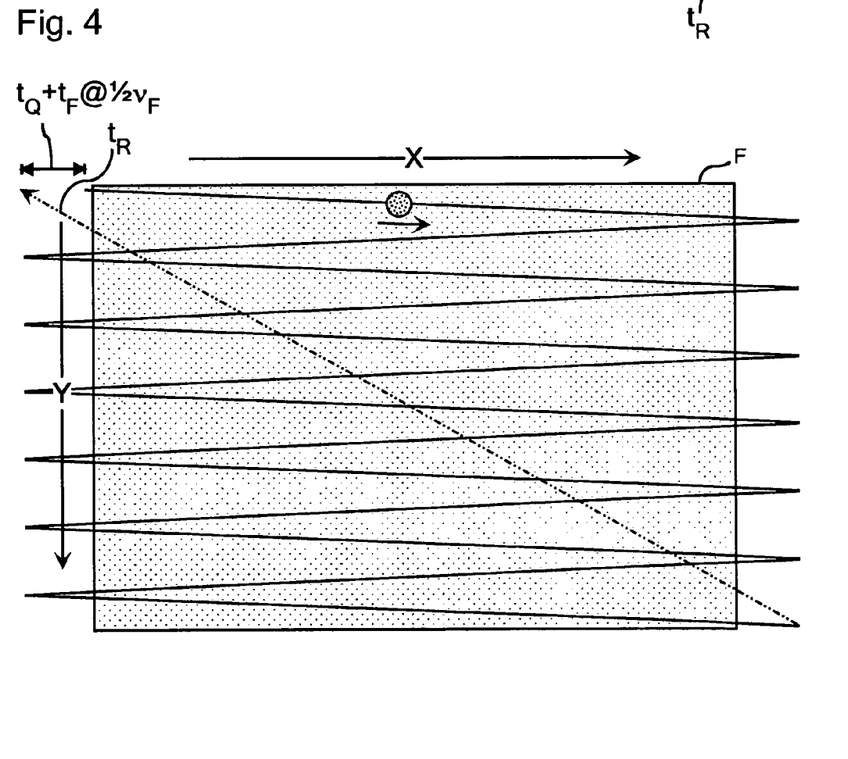
Figure 7:
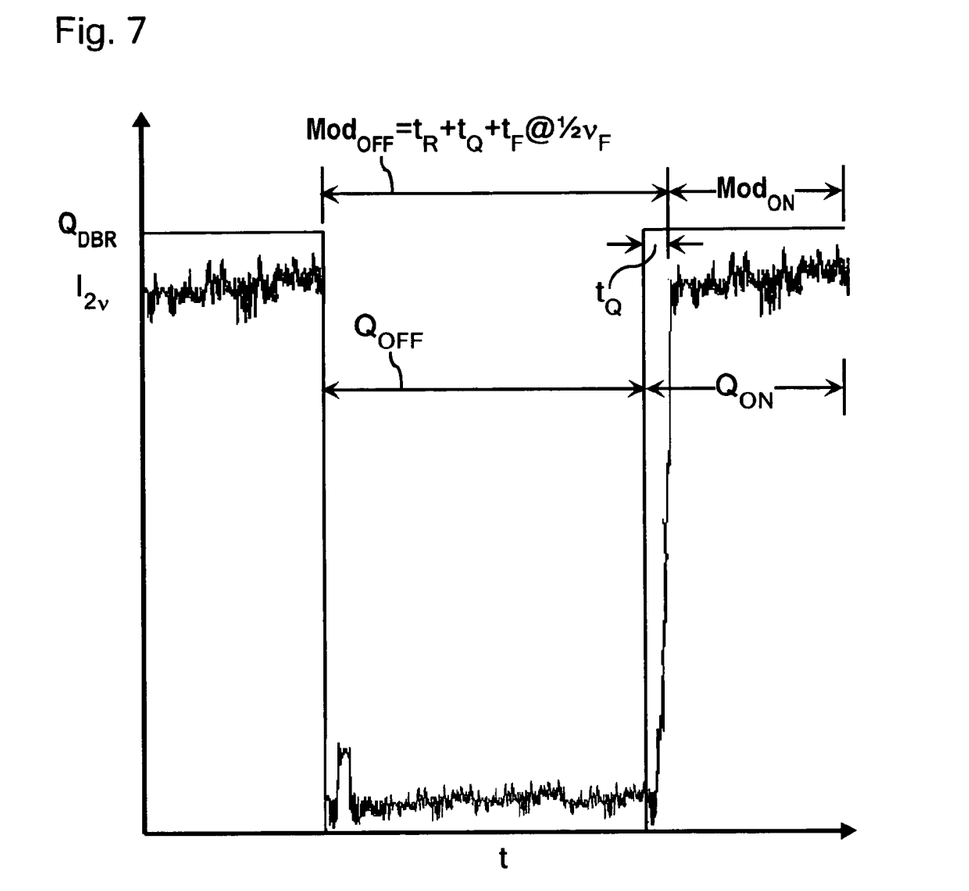

As is illustrated in FIGS. 4 and 7, the OFF time of the laser source 10 during projection can also be increased by displaying the image frames F at a frequency $v_F'$ that is half the standard refresh rate $v_F$. More specifically, in this embodiment, the active projection periods $Mod_{ON}$ are correlated with standard frame durations $t_F$ but are presented by projecting the sequence of pixelized image frames F at a reduced frame rate $v_F'$, which can be conveniently set at ½ $v_F$. Given such a projection mode, the inactive projection periods $Mod_{OFF}$ can be correlated with the transition periods $t_R$ between successive frames F in the sequence of pixelized image frames, the characteristic response time $t_Q$ of the heat generating elements, and the unused frame projection time $t_F$ created by projecting the sequence of pixelized image frames F at the reduced frame rate $v_F'$. Again, in executing this operation, it will typically be necessary to drive the laser at increased power $I_{2v}$ during the active projection periods $Mod_{ON}$ to keep average power and image brightness constant by compensating for the reduced frame rate $v_F'$. This technique is particularly useful because, although higher IR power is required to drive the frequency converted laser source, the efficiency of the packages increases non-linearly with increasing IP power.

Although FIG. 1 illustrates a single-color scanning laser projection system 100, it is contemplated that other types of laser projection systems, such as multi-color scanning-type projection systems, color-sequential frame projectors, and various types of spatial light modulator based systems (including digital light processing (DLP), transmissive LCD, and liquid crystal on silicon (LCOS)), incorporating laser-based light sources may benefit from the techniques described herein.

It is to be understood that the preceding detailed description is intended to provide an overview or framework for understanding the nature and character of the embodiments disclosed and claimed herein. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For example, it is contemplated that methods and systems according to the present invention may utilize one or more injection current control signals to improve stability in the emission wavelength of the laser source. The injection current control signal may, for example, be a phase conditioning signal in a DBR laser or a temperature control signal injected into one of the components of a semiconductor laser. In any case, the injection current control signal can be controlled to transition from an active conditioning state $Q_{ON}$ during the relatively high intensity active projection periods $Mod_{ON}$ to an inactive conditioning state $Q_{OFF}$ during the relatively low intensity inactive projection periods $Mod_{OFF}$. The injection current control signal can be controlled in concert with the aforementioned temperature control signal so that both signals transition from respective active states to inactive states during inactive projection periods $Mod_{OFF}$. Alternatively, the injection current control signal can be the only signal that is controlled to transition from respective active states to inactive states during inactive projection periods $Mod_{OFF}$, in which case it will typically be easier to ensure that the relatively low intensity inactive projection periods $Mod_{OFF}$ are longer than the characteristic response time $t_Q$ of the injection current conditioning mechanism of the laser source component.

As a further example, it is contemplated that wavelength conversion devices for use in the context of the present disclosure may comprise PPLN SHG crystals, other types of conventional or yet to be developed SHG crystals, or any other type of conventional or yet to be developed wavelength conversion device. Additionally, although the concepts of the present disclosure are described primarily in the context of DBR lasers, with or without phase sections, it is contemplated that the control schemes discussed herein will also have utility in a variety of types of semiconductor lasers, including but not limited to DFB lasers, Fabry-Perot lasers, and many types of external cavity lasers.

It should be further understood that references herein to particular steps or operations that are described or claimed herein as being performed "as a function" of a particular state, condition, value, or other type of variable or parameter should not be read to limit execution of the step or operation solely as a function of the named variable or parameter. Rather, it should be understood that additional factors may play a role in the performance of the step or operation.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the terms "substantially" or "approximately" are utilized herein to represent the inherent degree of uncertainty that may be attributed to any quantitative comparison, value, measurement, or other representation. The terms "substantially" and "approximately" are also utilized herein to represent the degree by which a quantitative representation. e.g., "substantially above zero," varies from a stated reference, e.g., "zero," and should be interpreted to require that the quantitative representation varies from the stated reference by a readily discernable amount.

It is also noted that recitations herein of a component of the present invention being "configured" or "programmed" in a particular way, to embody a particular property, or function in a particular manner, are structural recitations as opposed to recitations of intended use. More specifically, the references herein to the manner in which a component is "configured" or "programmed" denote an existing physical condition of the component and, as such, are to be taken as a definite recitation of the structural characteristics of the component.

What is claimed:

1. A method of operating a system for generating a projected laser image, the system comprising at least one laser source and associated laser projection optics, wherein the laser source comprises a semiconductor laser optically coupled to a wavelength conversion device, the semiconductor laser comprises a gain control element for intensity modulation of the laser source and one or more complementary control elements for controlling a complementary characteristic of the semiconductor laser, and the method comprises:
   utilizing a gain control signal applied to the gain control element for the intensity modulation;
   utilizing a complementary control signal applied to the complementary control element to improve emission in the laser source; and
   utilizing the laser source and the projection optics to display a sequence of pixelized image frames, wherein
      the sequence of pixelized image frames comprises an alternating sequence of relatively high intensity active projection periods $Mod_{ON}$ and relatively low intensity inactive projection periods $Mod_{OFF}$,
      the complementary control signal transitions between an active state $Q_{ON}$ during the relatively high intensity active projection periods $Mod_{ON}$ and an inactive state $Q_{OFF}$ during the relatively low intensity inactive projection periods $Mod_{OFF}$, and
      the transition of the complementary control signal from the inactive state $Q_{OFF}$ to the active state $Q_{ON}$ is conditioned to anticipate initiation of relatively high intensity active projection periods $Mod_{ON}$ such that it is optimized upon initiation of the relatively high intensity active projection periods $Mod_{ON}$.

2. A method as claimed in claim 1 wherein the complementary control signal transitions to the active state $Q_{ON}$ prior to initiation of the relatively high intensity active projection periods $Mod_{ON}$ such that it is optimized upon initiation of the relatively high intensity active projection periods $Mod_{ON}$.

3. A method as claimed in claim 1 wherein the complementary control signal comprises an amplitude overshoot that anticipates initiation of the relatively high intensity active projection periods $Mod_{ON}$ and decreases over time after initiation of the relatively high intensity active projection periods $Mod_{ON}$.

4. A method as claimed in claim 1 wherein the complementary control signal comprises a low pass filtered square wave that transitions to the active state $Q_{ON}$ prior to initiation of the relatively high intensity active projection periods $Mod_{ON}$.

5. A method as claimed in claim 1 wherein the complementary control element comprises at least one of the following elements:
   a wavelength tuning mechanism and the complementary control signal is utilized to control the emission wavelength of the semiconductor laser;
   a phase conditioning mechanism and the complementary control signal is utilized to control a phase section of the semiconductor laser;
   an optical alignment mechanism and the complementary control signal is utilized to control the optical alignment mechanism;
   a temperature control mechanism and the complementary control signal is utilized to control the temperature control mechanism of the semiconductor laser; or combinations thereof.

6. A method as claimed in claim 1 wherein:
   the active projection periods $Mod_{ON}$ are correlated with frame durations $t_F$ of the laser source and projection optics; and
   the inactive projection periods $Mod_{OFF}$ are correlated with transitions between successive frames in the sequence of pixelized image frames.

7. A method as claimed in claim 6 wherein the laser projection optics comprise raster scanning optics and the transitions between successive frames correspond to raster return and restart operations.

8. A method as claimed in claim 6 wherein the laser projection optics comprise non-scanning frame projection optics and the transitions between successive frames corresponds to multi-color projection periods.

9. A method as claimed in claim 1 wherein:
   the active projection periods $Mod_{ON}$ are correlated with reduced frame durations $t_F'$ of the laser source and projection optics; and
   the inactive projection periods $Mod_{OFF}$ are correlated with transitions between successive frames in the sequence of pixelized image frames and unused frame projection time created during execution of the reduced frame durations $t_F'$.

10. A method as claimed in claim 9 wherein an intensity difference between the relatively high intensity active projection periods $Mod_{ON}$ and the relatively low intensity inactive projection periods $Mod_{OFF}$ is sufficient to compensate for the reduced frame durations $t_F'$ of the laser source and projection optics.

11. A method as claimed in claim 1 wherein:
   the active projection periods $Mod_{ON}$ are correlated with frame durations $t_F$ of the laser source and projection optics;
   the inactive projection periods $Mod_{OFF}$ are correlated with transitions between successive frames in the sequence of pixelized image frames and unused frame projection time created by projecting the sequence of pixelized image frames at a reduced frame rate.

12. A method as claimed in claim 11 wherein an intensity difference between the relatively high intensity active projection periods $Mod_{ON}$ and the relatively low intensity inactive projection periods $Mod_{OFF}$ is sufficient to compensate for the reduced frame rate of the laser source and projection optics.

13. A method as claimed in claim 1, wherein:
   the laser source comprises at least one temperature-controlled laser source and the complementary control element comprises one or more heat generating elements configured to control the temperature of the laser source and the method comprises;
   a heating element control signal is applied to the heat generating elements to control the temperature of at least one component of the laser source to improve stability in the emission wavelength of the laser source;
   the heating element control signal transitions from an active heating state $Q_{ON}$ during the relatively high intensity active projection periods $Mod_{ON}$ to an inactive heating state $Q_{OFF}$ during the relatively low intensity inactive projection periods $Mod_{OFF}$, and the relatively low intensity inactive projection periods $Mod_{OFF}$ are longer than a characteristic response time $t_Q$ of the heat generating elements.

14. A method as claimed in claim 13 wherein the heating element control signal is applied to stabilize the output power of the laser source during the relatively high intensity active projection periods $Mod_{ON}$.

15. A method as claimed in claim 13 wherein the heating element control signal anticipates initiation of the relatively high intensity active projection periods $Mod_{ON}$.

16. A method as claimed in claim 13 wherein the heating element control signal is at least partially a function of sampled wavelength conversion device output intensity.

17. A method as claimed in claim 13 wherein the heat generating elements are thermally coupled to a wavelength selective section of the semiconductor laser or to the wavelength conversion device and comprise electrically resistive heating elements or electrodes positioned to inject electrical current into a wavelength selective section of the semiconductor laser.

18. A method as claimed in claim 1 wherein the system for generating a projected laser image comprises one or more additional laser sources defining a multi-color laser projection system.

19. A system for generating a projected laser image, the system comprising at least one laser source and associated laser projection optics, wherein the laser source comprises a semiconductor laser optically coupled to a wavelength conversion device, the semiconductor laser comprises a gain control element for intensity modulation of the laser source and one or more complementary control elements for controlling a complementary characteristic of the semiconductor laser, and the system is programmed to:
  utilize a gain control signal applied to the gain control element for the intensity modulation;
  utilize a complementary control signal applied to the complementary control element to improve emission in the laser source; and
  utilize the laser source and the projection optics to display a sequence of pixelized image frames, wherein
    the sequence of pixelized image frames comprises an alternating sequence of relatively high intensity active projection periods $Mod_{ON}$ and relatively low intensity inactive projection periods $Mod_{OFF}$,
    the complementary control signal transitions between an active state $Q_{ON}$ during the relatively high intensity active projection periods $Mod_{ON}$ and an inactive state $Q_{OFF}$ during the relatively low intensity inactive projection periods $Mod_{OFF}$, and
    the transition of the complementary control signal from the inactive state $Q_{OFF}$ to the active state $Q_{ON}$ is conditioned to anticipate initiation of relatively high intensity active projection periods $Mod_{ON}$ such that it is optimized upon initiation of the relatively high intensity active projection periods $Mod_{ON}$.

* * * * *